United States Patent [19]

Brehmer et al.

[11] Patent Number: 5,283,484
[45] Date of Patent: Feb. 1, 1994

[54] VOLTAGE LIMITER AND SINGLE-ENDED TO DIFFERENTIAL CONVERTER USING SAME

[75] Inventors: Geoffrey E. Brehmer; James R. Carbery, both of Austin, Tex.

[73] Assignee: Motorola, Inc., Schaumburg, Ill.

[21] Appl. No.: 959,578

[22] Filed: Oct. 13, 1992

[51] Int. Cl.$^5$ .......................... G06G 7/12; H03K 4/08
[52] U.S. Cl. ..................................... 307/555; 307/520; 307/494; 307/228; 307/261; 361/90; 328/167
[58] Field of Search ............... 307/540, 520, 555, 568, 307/494, 261, 228; 361/90; 328/167

[56] References Cited

U.S. PATENT DOCUMENTS

| | | | |
|---|---|---|---|
| 4,697,152 | 9/1987 | Westwick | 330/9 |
| 4,849,708 | 7/1989 | Brehmer et al. | 330/110 |
| 4,996,504 | 2/1991 | Huber et al. | 307/568 |
| 5,155,396 | 10/1992 | Maluberti et al. | 307/568 |

*Primary Examiner*—Margaret R. Wambach
*Attorney, Agent, or Firm*—Paul J. Polansky

[57] ABSTRACT

A voltage limiter (20) includes a resistor (21) receiving an input signal on a first terminal and providing an output signal on a second terminal, and a capacitor (22) connected between the second terminal of the resistor (21) and ground. Two transistors (23,26) biased by first and second bias voltages, respectively, are connected between the second terminal of the resistor and a second voltage terminal to clamp the output voltage between high and low voltage limits. A single-ended to differential converter (60) uses two such voltage limiters. A first voltage limiter (90) receives an input voltage, and has an output terminal connected to a positive input terminal of an amplifier (100). A second voltage limiter (92) has an input terminal connected to the second voltage terminal and an output terminal connected to a negative input terminal of the amplifier (100). A shared capacitor (83) is coupled between second terminals of resistors of the first (90) and second (92) voltage limiters.

17 Claims, 3 Drawing Sheets

VOLTAGE LIMITER AND SINGLE-ENDED TO DIFFERENTIAL CONVERTER USING SAME

FIELD OF THE INVENTION

This invention relates generally to electronic circuits, and more particularly, to voltage limiter circuits and single-ended to differential converters.

BACKGROUND OF THE INVENTION

Some circuits such as analog receivers are able to process input signals only within certain bounds of voltage, known as the input voltage range of the receiver. If an input signal is outside this range, then signal distortion and other undesirable effects occur. For example, power supply noise may be reflected in a received signal and may cause the received signal to be outside the input voltage range of the receiver's amplifiers. In this situation, it is necessary to somehow limit the received signal to upper and lower boundaries.

There are several known techniques to limit the amplitude of an input signal to the input voltage range of the amplifier. One technique compares the voltage on the input signal line with two reference voltages, corresponding to upper and lower limits of the input voltage range. If the input signal voltage exceeds the upper limit, the output of a first comparator causes a first reference voltage to be switched in, effectively clipping the input signal at the upper limit. Similarly, when the input signal voltage is less than the lower limit, a second comparator clips the input signal to a second reference voltage, effectively clipping the input signal at the lower limit. The disadvantage of this approach is that the two comparators require a significant amount of integrated circuit area.

Another voltage limiter, such as that disclosed by G. Brehmer and H. Jackson in U.S. Pat. No. 4,849,708, provides clamping transistors in feedback paths of a differential amplifier. However, this technique requires an additional differential amplifier, which consumes significant integrated circuit area and thus may not be desirable for cost-sensitive applications. Also, inserting an additional amplifier in the input signal path reduces the effective bandwidth in the receiver. In addition, such a circuit may be sensitive to power supply noise.

Summary of the Invention

Accordingly, there is provided, in one form, a voltage limiter comprising a resistor, a capacitor, and first and second transistors. The resistor has a first terminal for receiving an input signal, and a second terminal for providing an output signal on a node. The capacitor has a first terminal coupled to the node, and a second terminal coupled to a first power supply voltage terminal. The first transistor has a first current electrode coupled to a second power supply voltage terminal, a control electrode for receiving a first bias voltage, and a second current electrode coupled to the node. The second transistor has a first current electrode coupled to the node, a control electrode for receiving a second bias voltage, and a second current electrode coupled to the second power supply voltage terminal.

In another form, there is provided a single-ended to differential converter comprising first and second resistors, a capacitor, first through fourth transistors, and a differential amplifier. The first resistor has a first terminal for receiving an input signal, and a second terminal coupled to a first node. The second resistor has a first terminal coupled to a power supply voltage terminal, and a second terminal coupled to a second node. The capacitor has a first terminal coupled to the first node, and a second terminal coupled to the second node. The first transistor has a first current electrode coupled to the power supply voltage terminal, a control electrode for receiving a first bias voltage, and a second current electrode coupled to the first node. The second transistor has a first current electrode coupled to the first node, a control electrode for receiving the second bias voltage, and a second current electrode coupled to the power supply voltage terminal. The third transistor has a first current electrode coupled to the power supply voltage terminal, a control electrode for receiving the first bias voltage, and a second current electrode coupled to the second node. The fourth transistor has a first current electrode coupled to the second node, a control electrode for receiving the second bias voltage, and a second current electrode coupled to the power supply voltage terminal. The differential amplifier has a positive input terminal coupled to the first node, a negative input terminal coupled to the second node, a positive output terminal for providing a positive output of the converter, and a negative output terminal for providing a negative output of the converter.

These and other features and advantages will be more clearly understood from the following detailed description taken in conjunction with the accompanying drawings.

DETAILED DESCRIPTION OF A PREFERRED EMBODIMENT

Figure 1:
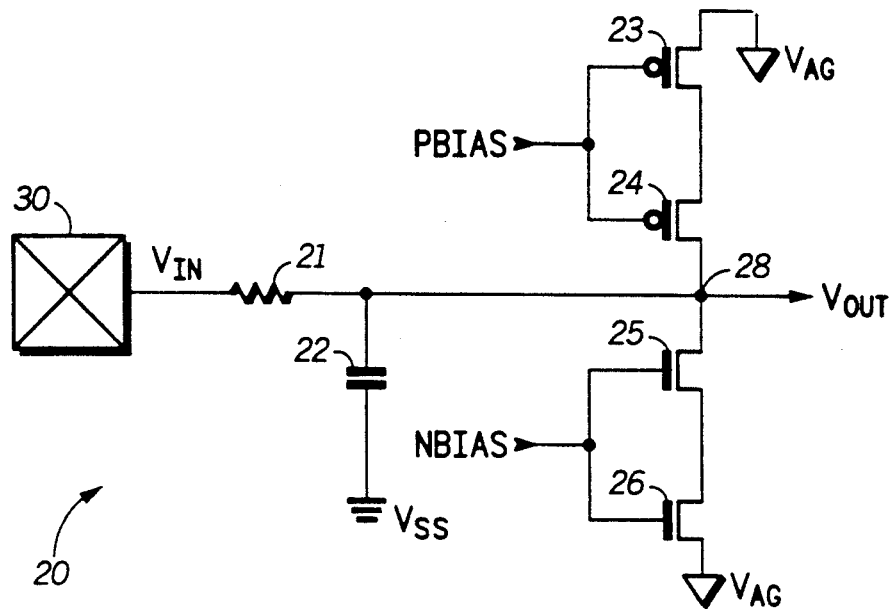
FIG. 1 illustrates in schematic form a voltage limiter circuit in accordance with the present invention.

FIG. 1 illustrates in schematic form a voltage limiter circuit 20 in accordance with the present invention. Voltage limiter circuit 20 includes generally a resistor 21, a capacitor 22, P-channel transistors 23 and 24, and N-channel transistors 25 and 26. FIG. 1 also illustrates a bonding pad 30 for receiving an input signal. Resistor 21 has a first terminal connected to bonding pad 30, and a second terminal connected to a node 28 and providing an output voltage of the voltage limiter labelled "$V_{OUT}$". Capacitor 22 has a first terminal connected to the second terminal of resistor 21 at node 28, and a second terminal connected to a power supply voltage terminal labelled "$V_{SS}$". $V_{SS}$ is a more-negative power supply voltage terminal having a nominal voltage of zero volts.

Transistor 23 has a source connected to a power supply voltage terminal labelled "$V_{AG}$", a gate for receiving a bias signal labelled "PBIAS", and a drain. $V_{AG}$ is an analog ground power supply voltage terminal which has a voltage roughly halfway between a more-positive power supply voltage and more-negative power supply voltage, or nominally about 2.25 volts. Transistor 24 has a source connected to the drain of transistor 23, a gate for receiving voltage PBIAS, and a drain connected to the second terminal of resistor 21. PBIAS is a voltage which is sufficient to bias P-channel transistors 23 and 24 to conduct a reference current. A bulk of each of transistors 23 and 24 is connected to a source thereof.

Transistor 25 has a source connected to the second terminal of resistor 21 at node 28, a gate for receiving a bias voltage labelled "NBIAS", and a drain. Transistor 26 has a source connected to the drain of transistor 25, a gate for receiving voltage NBIAS, a drain connected to $V_{AG}$, and a bulk connected to $V_{SS}$. NBIAS is a voltage which sufficient to bias N-channel transistors 25 and 26 to conduct a reference current. A bulk of each of transistors 25 and 26 is connected to $V_{SS}$.

If $V_{IN}$ exceeds $V_{AG}$ by more than a first predetermined amount, then node 28 becomes a source to transistor 24, and transistors 23 and 24 begin to conduct. The first predetermined amount corresponds to an upper limit of the input voltage range of an analog receiver (not shown) connected to voltage limiter 20. PBIAS is a voltage equal to a gate-to-source voltage of P-channel transistors sized similarly to transistors 23 and 24 and conducting a first reference current. The first reference current, designated "$I_{REFP}$", is equal to the current flowing through resistor 21 and through transistors 24 and 23 to $V_{AG}$ when the voltage at node 28 is at the upper limit.

If $V_{IN}$ is less than $V_{AG}$ by more than a second predetermined amount, then node 28 becomes a source to transistor 25, and transistors 25 and 26 begin to conduct. The predetermined amount corresponds to a lower limit of the input voltage range of the analog receiver connected to voltage limiter 20. NBIAS is a voltage equal to a gate-to-source voltage of N-channel transistors sized similarly to transistors 25 and 26 and conducting a second reference current. The second reference current, designated "$I_{REFN}$", is equal to the current flowing from $V_{AG}$ through transistors 26 and 25 and through resistor 21 to $V_{IN}$ when the voltage at node 28 is at the lower limit.

In other embodiments, transistor pairs 23 and 24, and 25 and 26, could each be replaced by a single transistor of the appropriate conductivity type. However, because the inclusion of extra cascode transistors 24 and 25 increases the output impedance on node 28, and because subsequent circuitry includes amplifiers using cascode transistors, the inclusion of cascode transistors is preferred.

Figure 2:
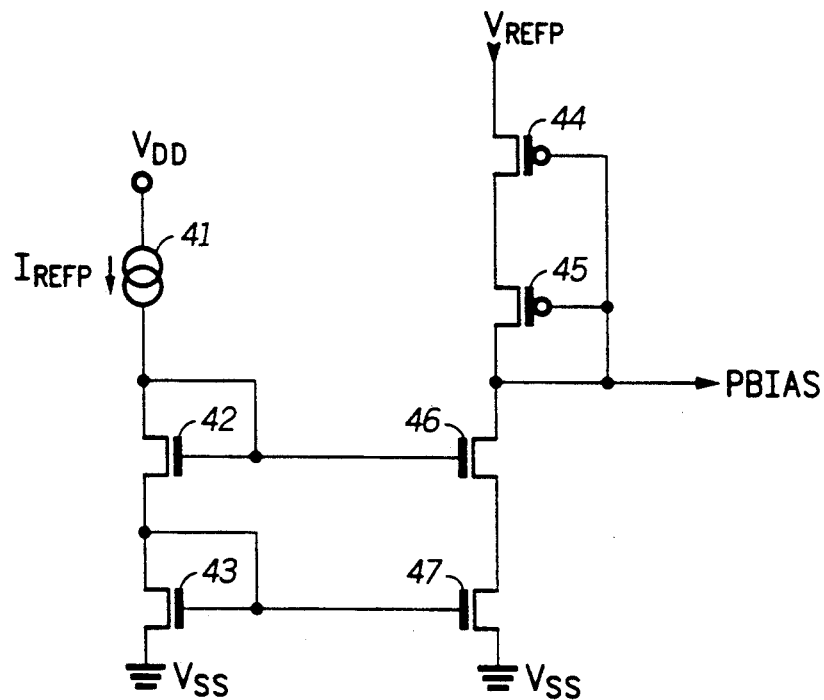
FIG. 2 illustrates in schematic form a bias voltage generator circuit providing a first bias voltage to the voltage limiter circuit of FIG. 1.

FIG. 2 illustrates in schematic form a bias voltage generator circuit 40 providing bias voltage PBIAS to voltage limiter circuit 20 of FIG. 1. Bias voltage generator circuit 40 includes generally a current source 41, N-channel transistors 42 and 43, P-channel transistors 44 and 45, and N-channel transistors 46 and 47. Current source 41 has a first terminal connected to a power supply voltage terminal labelled "$V_{DD}$", and a second terminal. $V_{DD}$ is a more-positive power supply voltage terminal with a nominal voltage of 5 volts but which may be as low as approximately 3 volts. Transistor 42 has a drain connected to the second terminal of current source 41, a gate connected to the drain thereof, and a source. Transistor 43 has a drain connected to the source of transistor 42, a gate connected to the drain thereof, and a source connected to $V_{SS}$. Transistor 44 has a source for receiving a reference voltage labelled "$V_{REFP}$", a gate, and a drain. $V_{REFP}$ is a reference voltage having a nominal value of apporximately 3.35 volts. Transistor 45 has a source connected to the drain of transistor 44, a gate, and a drain for providing bias voltage PBIAS and connected to the gates of transistors 44 and 45. Transistor 46 has a drain connected to the drain of transistor 45, a gate connected to the drain of transistor 42, and a source. Transistor 47 has a drain connected to the source of transistor 46, a gate connected to the drain of transistor 43, and a source connected to $V_{SS}$.

Current source 41 provides reference current $I_{REFP}$. Transistors 42, 43, 46, and 47 collectively form a cascode current mirror, which mirrors a current equal to $I_{REFP}$ from the drain of transistor 45. In the preferred embodiment, transistors 44 and 45 have the same gate width-to-length ratio as transistors 23 and 24 of FIG. 1. In other embodiments, transistors 44 and 45 could be ratioed to transistors 23 and 24, but $I_{REFP}$ must be similarly ratioed to provide the same current density through transistors 23 and 24. If $V_{MAX}$ is equal to the maximum value expected for $V_{IN}$, $V_{LIMITU}$ is equal to the value of $V_{IN}$ which causes transistors 23 and 24 to conduct, and $R_{21}$ is equal to the resistance of resistor 21, then $$I_{REFP} = (V_{MAX} - V_{LIMITU})/R_{21} \qquad [1].$$

In the illustrated embodiment, $V_{MAX}$ is equal to approximately 5.0 volts, and $V_{LIMITU}$ is equal to approximately 2.9 volts.

Figure 3:
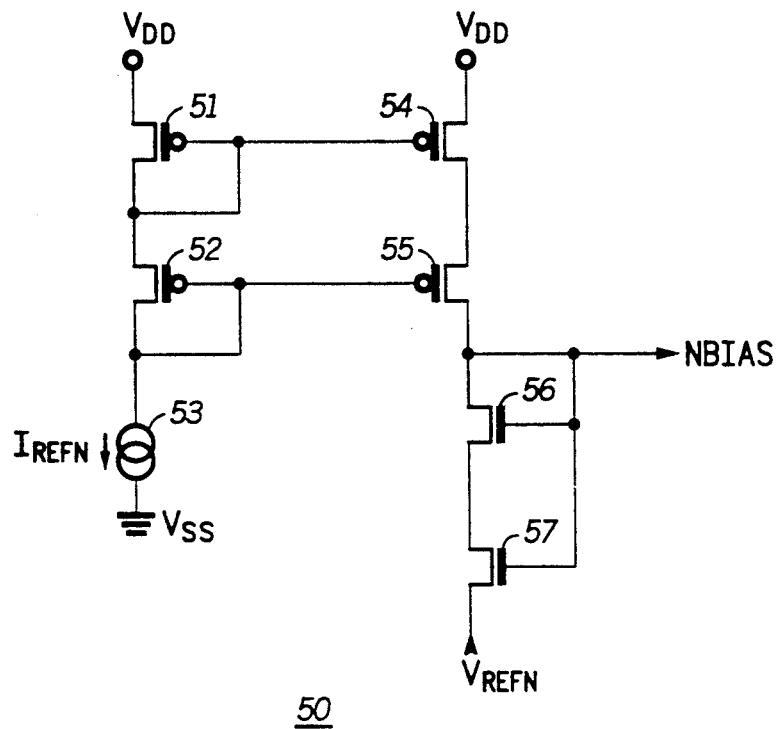
FIG. 3 illustrates in schematic form a bias voltage generator circuit providing a second bias voltage to the voltage limiter circuit of FIG. 1.

FIG. 3 illustrates in schematic form a bias voltage generator circuit 50 providing t... voltage NBIAS to voltage limiter circuit 20 of FIG. 1. Bias voltage generator circuit 50 includes generally P-channel transistors 51 and 52, a current source 53, P-channel transistors 54 and 55, and N-channel transistors 56 and 57. Transistor 51 has a source connected to $V_{DD}$, a gate, and a drain connected to the gate thereof. Transistor 52 has a source connected to the drain of transistor 51, a gate, and a drain connected to the gate thereof. Current source 53 has a first terminal connected to the drain of transistor 52, and a second terminal connected to $V_{SS}$. Transistor 54 has a source connected to $V_{DD}$, a gate connected to the drain of transistor 51, and a drain. Transistor 55 has a source connected to the drain of transistor 54, a gate connected to the drain of transistor 52, and a drain for providing voltage NBIAS. Transistor 56 has a drain connected to the drain of transistor 55, a gate connected to the drain thereof, and a source. Transistor 57 has a drain connected to the source of transistor 56, a gate connected to the drain of transistor 56, and a source for receiving a reference voltage labelled "$V_{REFN}$". $V_{REFN}$ is a reference voltage having a nominal value of approximately 1.15 volts.

current source 53 provides reference current $I_{REFN}$. Transistors 51, 52, 54, and 55 collectively form a cascode current mirror, which mirrors a current equal to $I_{REFN}$ into the drain of transistor 56. In the preferred embodiment, transistors 56 and 57 have the same gate width-to-length ratio as transistors 25 and 26 of FIG. 1. In other embodiments, transistors 56 and 57 could be ratioed to transistors 25 and 26, but $I_{REFN}$ must be similarly ratioed to provide the same current density through transistors 25 and 26. If $V_{MIN}$ is equal to the minimum value expected for $V_{IN}$, $V_{LIMITL}$ is equal to the value of $V_{IN}$ which causes transistors 23 and 24 to conduct, and $R_{21}$ is equal to the resistance of resistor 21, then $$I_{REFN} = (V_{LIMITL} - V_{MIN})/R_{21} \quad [2].$$

In the illustrated embodiment, $V_{LIMITL}$ is equal to approximately 1.4 volts, and $V_{MIN}$ is equal to approximately 0 volts.

Figure 4:
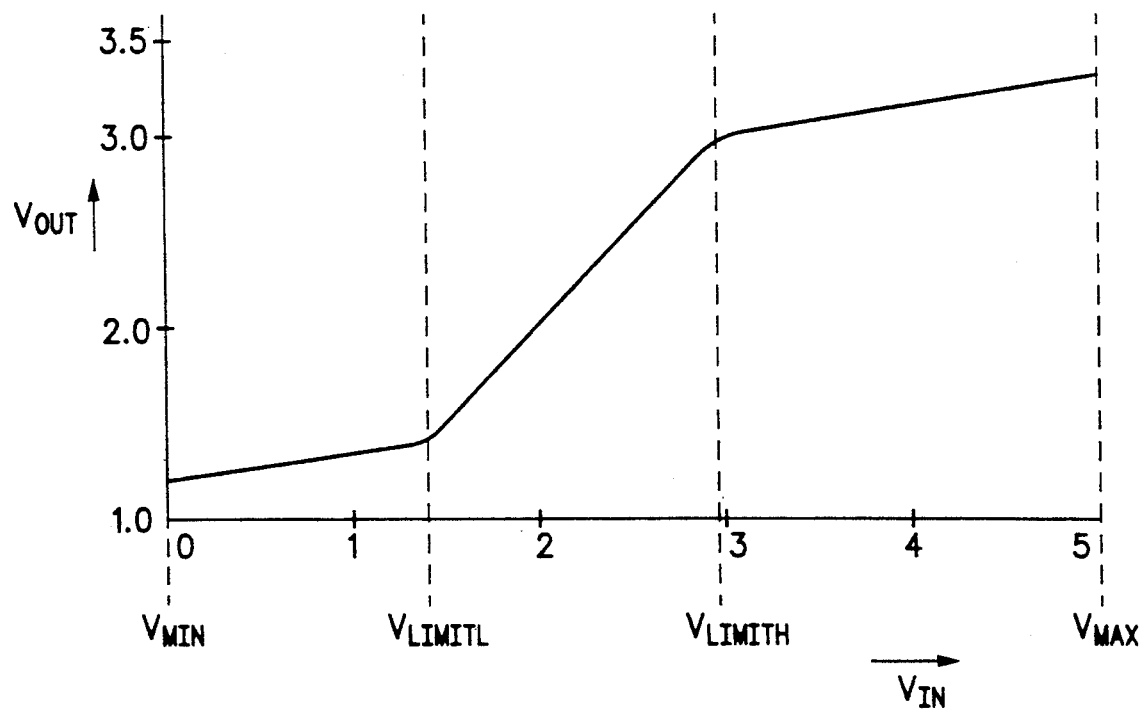
FIG. 4 illustrates in graphical form the transfer function of the voltage limiter circuit of FIG. 1.

FIG. 4 illustrates in graphical form the transfer function of voltage limiter circuit 20 of FIG. 1. The horizontal axis represents $V_{IN}$, while the vertical axis represents $V_{OUT}$. There are four significant values for $V_{IN}$ along the horizontal axis. Between $V_{MIN}$ and $V_{LIMITL}$, transistors 25 and 26 are conductive and maintain $V_{OUT}$ within the dynamic range of a subsequent amplifier. Between $V_{LIMITL}$ and $V_{LIMITH}$, the transfer function is linear because neither transistor pair 23 and 24, nor transistor pair 25 and 26, are conductive. Between $V_{LIMITH}$ and $V_{MAX}$, transistors 23 and 24 are conductive to maintain $V_{OUT}$ within the dynamic range of the subsequent amplifier. As FIG. 4 illustrates, $V_{OUT}$ is maintained between 1.0 and 3.5 volts as $V_{IN}$ varies between 0 and 5 volts.

Figure 5:
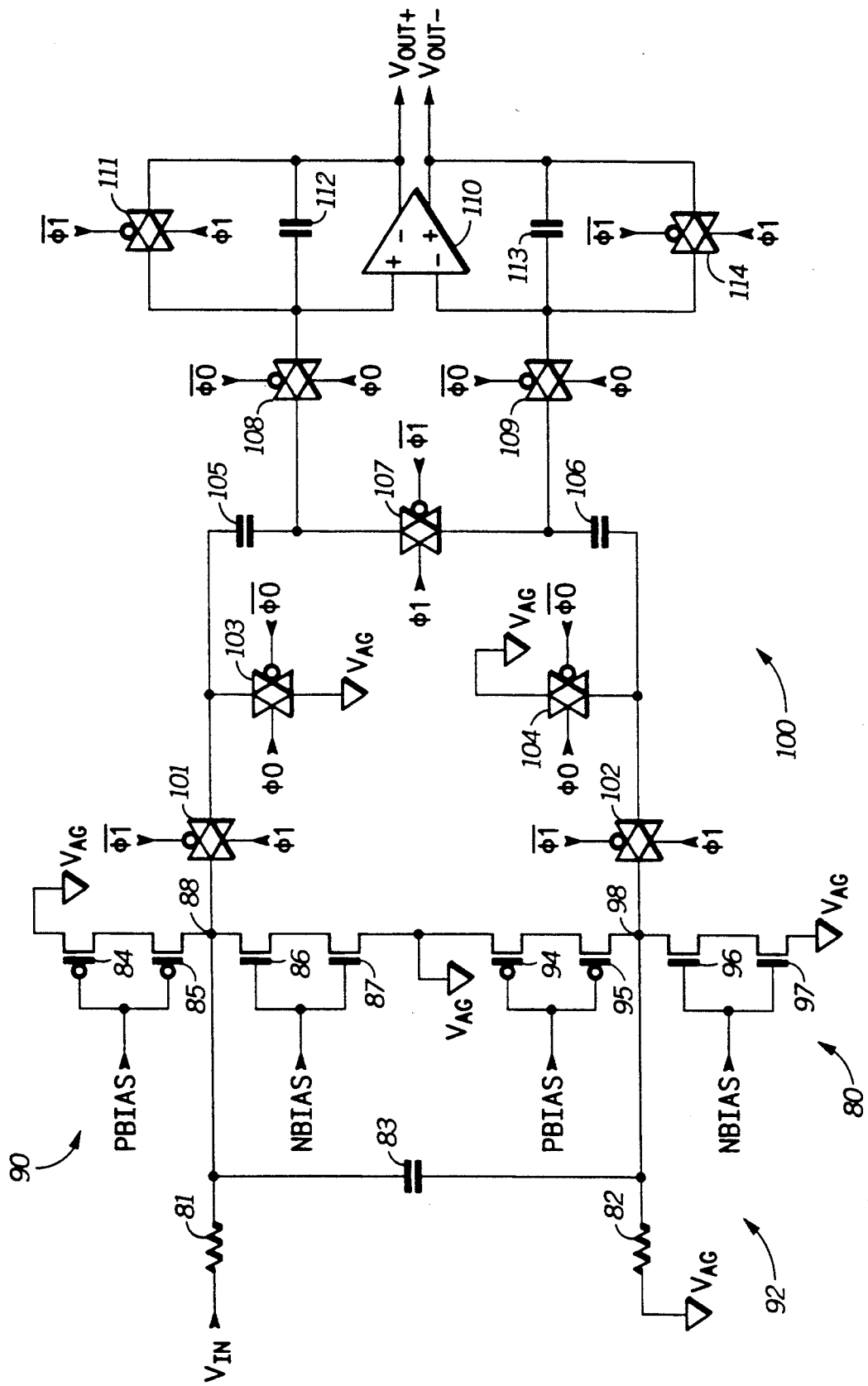
FIG. 5 illustrates in schematic form a single-ended to differential converter using a voltage limiter in accordance with the present invention.

FIG. 5 illustrates in schematic form a single-ended to differential converter 60 using a voltage limiter in accordance with the present invention. Single-ended to differential converter 60 includes generally a voltage limiter 80 and an amplifier 100. Voltage limiter 80 includes generally resistors 81 and 82, a capacitor 83, P-channel transistors 84 and 85, N-channel transistors 86 and 87, P-channel transistors 94 and 95, and N-channel transistors 96 and 97. Amplifier 100 includes transmission gates 101–104, capacitors 105 and 106, transmission gates 107–109, a fully-differential amplifier 110, a transmission gate 111, capacitors 112 and 113, and a transmission gate 114.

Resistor 81 has a first terminal for receiving input voltage $V_{IN}$, and a second terminal. Resistor 82 has a first terminal connected to $V_{AG}$, and a second terminal. Capacitor 83 has a first terminal connected to the second terminal of resistor 81, and a second terminal connected to the second terminal of resistor 82. Transistor 84 has a source connected to $V_{AG}$, a gate for receiving voltage PBIAS, and a drain. Transistor 85 has a source connected to the drain of transistor 84, a gate for receiving voltage PBIAS, and a drain connected to the second terminal of resistor 81. Transistor 86 has a source connected to the second terminal of resistor 81, a gate for receiving voltage NBIAS, and a drain. Transistor 87 has a source connected to the drain of transistor 86, a gate for receiving voltage NBIAS, and a drain connected to $V_{AG}$. Transistor 94 has a source connected to $V_{AG}$, a gate for receiving voltage PBIAS, and a drain. Transistor 95 has a source connected to the drain of transistor 94, a gate for receiving voltage PBIAS, and a drain connected to the second terminal of resistor 82. Transistor 96 has a source connected to the second terminal of resistor 82, a gate for receiving voltage NBIAS, and a drain. Transistor 97 has a source connected to the drain of transistor 96, a gate for receiving voltage NBIAS, and a drain connected to $V_{AG}$. Collectively, resistor 81, capacitor 83, and transistors 84–87 form a first voltage limiter 90. Resistor 82, capacitor 83, and transistors 94–97 form a second voltage limiter 92. Capacitor 83 is shared between voltage limiters 90 and 92.

In amplifier 100, each transmission gate has first and second terminals and is operative in response to one of two clock signals. Transmission gates operative during a clock signal labelled "$\phi 0$" have a positive control terminal for receiving signal $\phi 0$ and a negative control terminal for receiving a complement of signal $\phi 0$ labelled "$\overline{\phi 0}$". Transmission gates operative during a clock signal labelled "$\phi 1$" have a positive control terminal for receiving signal $\phi 1$ and a negative control terminal for receiving a complement of signal $\phi 1$ labelled "$\overline{\phi 1}$".

Transmission gate 101 has a first terminal connected to the second terminal of resistor 81, and a second terminal, and is operative during $\phi 1$. Transmission gate 102 has a first terminal connected to the second terminal of resistor 82, and a second terminal, and is operative during $\phi 1$. Transmission gate 103 has a first terminal connected to the second terminal of transmission gate 101, and a second terminal connected to $V_{AG}$, and is operative during $\phi 0$. Transmission gate 104 has a first terminal connected to the second terminal of transmission gate 102, and a second terminal connected to $V_{AG}$, and is operative during $\phi 0$.

Capacitor 105 has a first terminal connected to the second terminal of transmission gate 101, and a second terminal. Capacitor 106 has a first terminal connected to the second terminal of transmission gate 102, and a second terminal. Transmission gate 107 has a first terminal connected to the second terminal of capacitor 105, and a second terminal connected to the second terminal of capacitor 106, and is operative during $\phi 1$. Transmission gate 108 has a first terminal connected to the second terminal of capacitor 105, and a second terminal, and is operative during $\phi 0$. Transmission gate 109 has a first terminal connected to the second terminal of capacitor 106, and a second terminal, and is operative during $\phi 0$.

Amplifier 110 has a positive input terminal connected to the second terminal of transmission gate 108, a negative input terminal connected to the second terminal of transmission gate 109, a negative output terminal for providing a positive output signal of single-ended to differential converter 60 labelled "$V_{OUT+}$", and a positive output terminal for providing a negative output signal of single-ended to differential converter 60 labelled "$V_{OUT-}$". Note that amplifier 110 is fully symmetrical and the designation of positive and negative input and output terminals is interchangeable. Transmission gate 111 has a first terminal connected to the second terminal of transmission gate 108, and a second terminal connected to the negative output terminal of amplifier 110, and is operative during $\phi 1$. Capacitor 112 has a first terminal connected to the positive input terminal of amplifier 110, and a second terminal connected to the negative output terminal of amplifier 110. Capacitor 113 has a first terminal connected to the negative input terminal of amplifier 110, and a second terminal connected to the positive output terminal of amplifier 110. Transmission gate 114 has a first terminal connected to the second terminal of transmission gate 109, and a second terminal connected to the positive output terminal of amplifier 110, and is operative during $\phi 1$.

Voltage limiter 80 and amplifier 100 together increase the system power supply rejection ratio (PSRR) by creating a pseudo-balanced voltage limiter on a single-ended to differential converter. Voltage limiter 92 creates a dummy balanced node on node 98 that has equal noise impairments to those on node 88. Amplifier 100 thus sees any power supply noise as a common-mode noise component between nodes 88 and 98; by rejecting the common-mode component, amplifier 100 increases system noise rejection. Thus, single-ended to differential converter 60 improves the system PSRR over known single-ended to differential converters which are subject to large power supply noise transients.

While the invention has been described in the context of a preferred embodiment, it will be apparent to those skilled in the art that the present invention may be modified in numerous ways and may assume many embodiments other than that specifically set out and described above. For example, a voltage limiter may omit the cascode transistors in other embodiments. Also, voltage limiters 90 and 92 may be used with other amplifier types besides switched-capacitor amplifier 100 to form a single-ended to differential converter. Accordingly, it is intended by the appended claims to cover all modifications of the invention which fall within the true spirit and scope of the invention.

We claim:

1. A voltage limiter comprising:
   a resistor having a first terminal for receiving an input signal, and a second terminal for providing an output signal on a node;
   a capacitor having a first terminal couled to said node, and a second terminal coupled to a first power supply voltage terminal;
   a first transistor having a first current electrode coupled to a second power supply voltage terminal, a control electrode for receiving a first bias voltage, and a second current electrode coupled to said node; and
   a second transistor having a first current electrode coupled to said node, a control electrode for receiving a second bias voltage, and a second current electrode coupled to said second power supply voltage terminal.

2. The voltage limiter of claim 1 wherein said first transistor is a P-channel MOS transistor, and wherein said second transistor is an N-channel MOS transistor.

3. The voltage limiter of claim 1 wherein said second power supply voltage terminal provides an analog ground voltage thereon.

4. The voltage limiter of claim 3 wherein said analog ground voltage is substantially halfway between positive and negative power supply voltage terminals.

5. The voltage limiter of claim 1 further comprising:
   first bias means for providing said first bias voltage; and
   second bias means for providing said second bias signal.

6. The voltage limiter of claim 1 further comprising:
   a third transistor having a first current electrode coupled to said second current electrode of said first transistor, a control electrode for receiving said first bias voltage, and a second current electrode coupled to said node; and
   a fourth transistor having a first current electrode coupled to said node, a control electrode for receiving said second bias voltage, and a second current electrode coupled to said first current electrode of said second transistor.

7. The voltage limiter of claim 6, wherein said first and second transistors are P-channel MOS transistors, and wherein said third and fourth transistors are N-channel MOS transistors.

8. The voltage limiter of claim 6 wherein said second power supply voltage terminal provides an analog ground voltage thereon.

9. The voltage limiter of claim 8 wherein said analog ground voltage is substantially halfway between positive and negative power supply voltage terminals.

10. The voltage limiter of claim 6 further comprising:
    first bias means for providing said first bias voltage; and
    second bias means for providing said second bias voltage.

11. A single-ended to differential converter comprising:
    a first resistor having a first terminal for receiving an input signal, and a second terminal coupled to a first node;
    a second resistor having a first terminal coupled to a power supply voltage terminal, and a second terminal coupled to a second node;
    a capacitor having a first terminal coupled to said first node, and a second terminal coupled to said second node;
    a first transistor having a first current electrode coupled to said power supply voltage terminal, a control electrode for receiving a first bias voltage, and a second current electrode coupled to said first node;
    a second transistor having a first current electrode coupled to said first node, a control electrode for receiving said second bias voltage, and a second current electrode coupled to said power supply voltage terminal;
    a third transistor having a first current electrode coupled to said power supply voltage terminal, a control electrode for receiving said first bias voltage, and a second current electrode coupled to said second node;
    a fourth transistor having a first current electrode coupled to said second node, a control electrode for receiving said second bias voltage, and a second current electrode coupled to said power supply voltage terminal; and
    a differential amplifier having a positive input terminal coupled to said first node, a negative input terminal coupled to said second node, a positive output terminal for providing a positive output of the converter, and a negative output terminal for providing a negative output of the converter.

12. The single-ended to differential converter of claim 11 further comprising:
    a fifth transistor having a first current electrode coupled to said second current electrode of said first transistor, a control electrode for receiving said first bias voltage, and a second current electrode coupled to said first node;
    a sixth transistor having a first current electrode coupled to said first node, a control electrode for receiving said second bias voltage, and a second current electrode coupled to said first current electrode of said second transistor;
    a seventh transistor having a first current electrode coupled to said second current electrode of said third transistor, a control electrode for receiving said first bias voltage, and a second current electrode coupled to said second node; and
    a eighth transistor having a first current electrode coupled to said second node, a control electrode for receiving said second bias voltage, and a second current electrode coupled to said first current electrode of said fourth transistor.

13. The single-ended to differential converter of claim 12 wherein said first, third, fifth, and seventh transistors are P-channel MOS transistors, and wherein said second, fourth, sixth, and eighth transistors are N-channel MOS transistors.

14. The single-ended to differential converter of claim 11 wherein said differential amplifier is characterized as being a switched-capacitor amplifier.

15. A single-ended to differential converter comprising:
- a first resistor having a first terminal for receiving an input signal, and a second terminal for providing an output signal;
- a second resistor having a first terminal coupled to a power supply voltage terminal, and a second terminal;
- a capacitor having a first terminal coupled to said second terminal of said first resistor, and a second terminal coupled to said second terminal of said second resistor;
- a first transistor having a first current electrode coupled to said power supply voltage terminal, a control electrode for receiving a first bias voltage, and a second current electrode;
- a second transistor having a first current electrode coupled to said second current electrode of said first transistor, a control electrode for receiving said first bias voltage, and a second current electrode coupled to said second terminal of said first resistor;
- a third transistor having a first current electrode coupled to said second terminal of said first resistor, a control electrode for receiving a second bias voltage, and a second current electrode;
- a fourth transistor having a first current electrode coupled to said second current electrode of said third transistor, a control electrode for receiving said second bias voltage, and a second current electrode coupled to said power supply voltage terminal;
- a fifth transistor having a first current electrode coupled to said power supply voltage terminal, a control electrode for receiving said first bias voltage, and a second current electrode;
- a sixth transistor having a first current electrode coupled to said second current electrode of said fifth transistor, a control electrode for receiving said first bias voltage, and a second current electrode coupled to said second terminal of said second resistor;
- a seventh transistor having a first current electrode coupled to said second terminal of said second resistor, a control electrode for receiving said second bias voltage, and a second current electrode;
- an eighth transistor having a first current electrode coupled to said second current electrode of said seventh transistor, a control electrode for receiving said second bias voltage, and a second current electrode coupled to said power supply voltage terminal; and
- a differential amplifier having a positive input terminal coupled to said second terminal of said first resistor, a negative input terminal coupled to said second terminal of said second resistor, a positive output terminal for providing a positive output of the converter, and a negative output terminal for providing a negative output of the converter.

16. The single-ended to differential converter of claim 15 wherein said first, second, fifth, and sixth transistors are P-channel MOS transistors, and wherein said third, fourth, seventh and eighth transistors are N-channel MOS transistors.

17. The single-ended to differential converter of claim 15 wherein said differential amplifier is characterized as being a switched-capacitor amplifier.

* * * * *

UNITED STATES PATENT AND TRADEMARK OFFICE
CERTIFICATE OF CORRECTION

PATENT NO. : 5,283,484

DATED : February 1, 1994

INVENTOR(S) : Geoffrey E. Brehmer and James R. Carbery

It is certified that error appears in the above-identified patent and that said Letters Patent is hereby corrected as shown below:

Column 7, line 50, change "signal" to --voltage--

Signed and Sealed this

Fifth Day of July, 1994

*Attest:*

BRUCE LEHMAN

*Attesting Officer*        *Commissioner of Patents and Trademarks*